United States Patent
Jiang et al.

(10) Patent No.: US 8,008,842 B2
(45) Date of Patent: Aug. 30, 2011

(54) MICROMACHINED PIEZOELECTRIC ULTRASOUND TRANSDUCER ARRAYS

(75) Inventors: Xiaoning Jiang, State College, PA (US); Wesley S. Hackenberger, State College, PA (US); Kevin A. Snook, State College, PA (US)

(73) Assignee: TRS Technologies, Inc., State College, PA (US)

( * ) Notice: Subject to any disclaimer, the term of this patent is extended or adjusted under 35 U.S.C. 154(b) by 82 days.

(21) Appl. No.: 12/258,615

(22) Filed: Oct. 27, 2008

(65) Prior Publication Data

US 2009/0108708 A1    Apr. 30, 2009

Related U.S. Application Data

(60) Provisional application No. 61/000,589, filed on Oct. 26, 2007.

(51) Int. Cl.
  *H01L 41/04* (2006.01)
  *H01L 41/08* (2006.01)

(52) U.S. Cl. ............... 310/334; 310/336; 310/337

(58) Field of Classification Search .......... 310/334–337; 600/457, 459
  See application file for complete search history.

(56) References Cited

U.S. PATENT DOCUMENTS

| | | | |
|---|---|---|---|
| 4,683,396 A | 7/1987 | Takeuchi et al. | |
| 4,803,392 A | 2/1989 | Kushida et al. | |
| 5,368,035 A | 11/1994 | Hamm et al. | |
| 5,539,965 A * | 7/1996 | Safari et al. | 29/25.35 |
| 5,655,276 A | 8/1997 | Pattanayak et al. | |
| 5,744,898 A * | 4/1998 | Smith et al. | 310/334 |
| 5,767,612 A | 6/1998 | Takeuchi et al. | |
| 5,796,207 A * | 8/1998 | Safari et al. | 310/358 |
| 6,019,727 A | 2/2000 | Koger et al. | |
| 6,020,675 A * | 2/2000 | Yamashita et al. | 310/358 |
| 6,028,389 A | 2/2000 | Bernstein | |
| 6,104,126 A * | 8/2000 | Gilmore | 310/334 |
| 6,111,818 A * | 8/2000 | Bowen et al. | 367/140 |
| 6,183,578 B1 | 2/2001 | Ritter et al. | |
| 6,441,538 B1 * | 8/2002 | Spigelmyer | 310/334 |
| 6,503,204 B1 | 1/2003 | Sumanaweera et al. | |
| 6,522,051 B1 * | 2/2003 | Nguyen et al. | 310/336 |

(Continued)

FOREIGN PATENT DOCUMENTS

WO    2006093913    9/2006

OTHER PUBLICATIONS

S. Wang, et al., "Deep Reactive Ion Etching of Lead Zirconate Titanate Using Sulfur Hexafluoride Gas", J. Am. Ceram. Soc., 82(5) 1339-1341, 1999.

(Continued)

*Primary Examiner* — J. SanMartin
(74) *Attorney, Agent, or Firm* — McNees Wallace & Nurick LLC

(57) ABSTRACT

A piezoelectric composite micromachined ultrasound transducer including single and multilayer 1-D and 2-D arrays having through-wafer-vias (TWVs) that significantly decreased electrical impedance per element, and hence the improved electrical impedance matching to T/R electronics and improved signal to noise ratio is disclosed. The TWVs facilitate integrated interconnection in single element transducers (positive and negative contact on the same side) and array transducers (contact pads array for integration with T/R switches and/or pre-amplifier circuits).

8 Claims, 6 Drawing Sheets

U.S. PATENT DOCUMENTS

| | | | |
|---|---|---|---|
| 6,659,954 | B2 | 12/2003 | Robinson |
| 6,669,644 | B2 * | 12/2003 | Miller .......................... 600/459 |
| 6,758,094 | B2 * | 7/2004 | Miller .......................... 73/632 |
| 6,858,969 | B2 | 2/2005 | Bi et al. |
| 6,995,500 | B2 * | 2/2006 | Yogeswaren ................. 310/334 |
| 7,513,147 | B2 * | 4/2009 | Yogeswaren ............. 73/152.58 |
| 7,567,016 | B2 * | 7/2009 | Lu et al. ....................... 310/322 |
| 2001/0042291 | A1 | 11/2001 | Esashi et al. |
| 2003/0067249 | A1 | 4/2003 | Lockwood et al. |
| 2003/0114760 | A1 | 6/2003 | Robinson |
| 2004/0085858 | A1 | 5/2004 | Khuri-Yakub et al. |
| 2006/0028099 | A1 * | 2/2006 | Frey .............................. 310/334 |
| 2006/0173348 | A1 | 8/2006 | Wilser et al. |
| 2006/0238067 | A1 * | 10/2006 | Dausch ......................... 310/311 |
| 2007/0038111 | A1 * | 2/2007 | Rehrig et al. ................. 600/459 |

OTHER PUBLICATIONS

M. Bale, et al., "Reactive Ion Etching of Piezoelectric Pb (ZR.sub.xTi.sub.1-x)O.sub.3 in a SF.sub.6 Plasma", J. Vas. Sci. Technol. A 17(5), pp. 2467-2469, Sep./Oct. 1999.

M. Bale, et al., "Deep Plasma Etching of Piezoelectric PZT with SF.sub.6", J. Vas. Sci. Technol. B. 19(6), pp. 2020-2025, Nov./Dec. 2001.

F. Akasheh, et al., "Development of Piezoelectric Micromachined Ultrasonic Transducers", www.sciencedirect.com, Sensor and Actuators A 111, pp. 275-287, 2004.

A.M. Efremov, et al., "Etching Mechanism of Pb(ZR, Ti)0.sub.3 Thin films in C1.sub.2/Ar Plasma", Plasma Chemistry and Plasma Processing 24(1), pp. 13-28, Mar. 2004.

\* cited by examiner

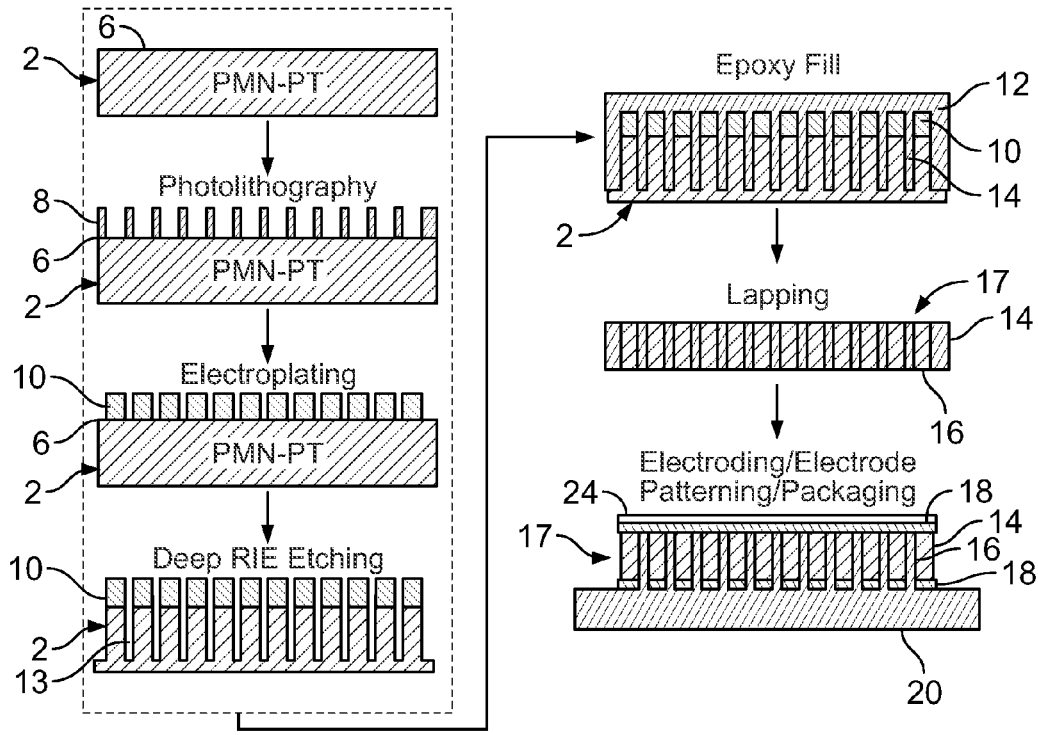
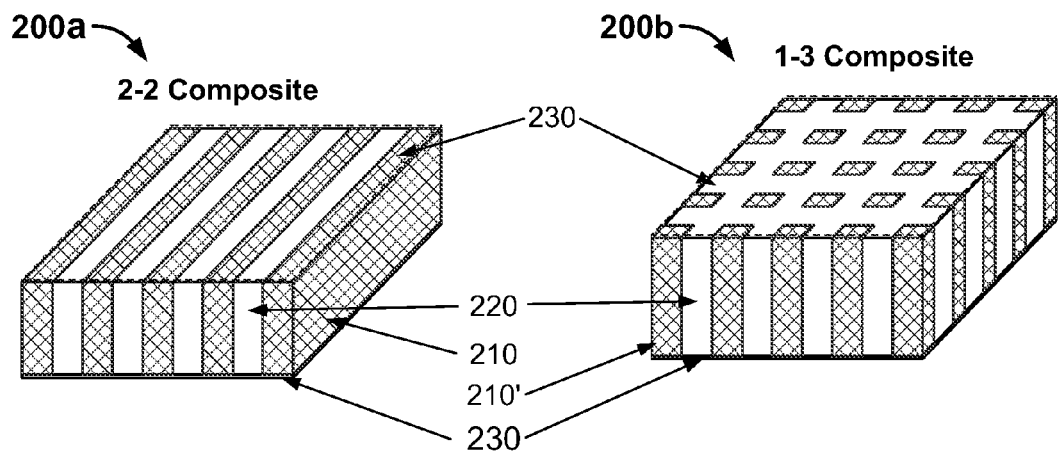
FIG. 1
FIG. 2A  FIG. 2B

MICROMACHINED PIEZOELECTRIC ULTRASOUND TRANSDUCER ARRAYS

CROSS-REFERENCE TO RELATED APPLICATIONS

This application claims priority to U.S. Provisional Patent Application No. 61/000,589 filed on Oct. 26, 2007, entitled "MICROMACHINED ULTRASONIC TRANSDUCER ARRAYS" which is herein incorporated by reference in its entirety.

STATEMENT OF FEDERALLY SPONSORED RESEARCH

Portions of the invention disclosed herein were reduced to practice with the support of the National Institute of Health, Grant No. 1R43EB007853-01. The U.S. Government may have certain rights in this invention.

FIELD OF THE INVENTION

The present invention is directed to ultrasonic transducers and more particularly to arrays of ultrasonic transducers.

BACKGROUND OF THE INVENTION

Ultrasound transducers and transducer arrays are widely used in both medical imaging and imaging for nondestructive testing (NDT) and/or nondestructive evaluation (NDE). However, the manufacture of one dimensional and two dimensional ultrasound transducer arrays presents a number of challenges.

Conventional dicing based fabrication of large numbers of small array elements is a slow and expensive process, especially for PMN-PT single crystal array fabrication. Furthermore, high electrical impedance per element in 2-D arrays results in a poor match to transmitter/receiver (T/R) electronics and poor signal to noise ratios (SNR).

Three methods have been used to try to develop 2-D transducer array technology: 1) Use of multilayer ceramic processing (co-firing) or composite stacking to form low impedance, high sensitivity array elements; 2) conventional array fabrication (dicing) with hybrid electronic interconnect methods to integrate preamplifier circuitry into the transducer head; and 3) capacitive micromachined ultrasound transducer (cMUT) technology.

The first of these methods makes use of ceramic tape casting and screen printing (multilayer ceramic capacitor and ceramic electronic substrate manufacturing methods) to form arrays of multilayer piezoelectric resonators with higher capacitance than single diced elements. This method is very good at decreasing element impedance since it varies as the inverse square of the layer count. However, significant difficulties are associated with interconnecting the layers in each element to the array cable which requires vias running to each element. The minimum size and spacing of via holes that can be formed by ceramic packaging methods are on the order of the array element spacing. Therefore, the inter-element spaces would be largely filled with metal conductor vias, which would result in unacceptable levels of inter-element cross talk. Stacking diced composites and composites made by injection molding have also been attempted. However, in these cases no acceptable interconnection method has been developed.

The use of hybrid electronic interconnections to integrate preamplifier circuitry into the transducer head has been successfully commercialized. This greatly reduces the SNR problem associated with high impedance elements by eliminating the coaxial cable connection between transducer and preamplifier. However, because it is a diced array with a very large number of elements, it is very expensive and therefore practically limited to premium systems.

cMUTs may provide significant contributions to piezoelectric transducer technology, but they also represent a great challenge to manufacturing technology. cMUTs are an application of microelectromechanical systems (MEMS) technology. cMUTs consist of diaphragms of silicon nitride suspended over a tiny cavity. Electrostatic forces are used to vibrate the membrane producing an ultrasonic wave. In most applications, cMUTs are made using photolithography using a batch wafer processes, providing a potentially a low cost, 2-D array technology. cMUTs also have a very good acoustic impedance match to tissue, and the effective coupling coefficient can approach 1 for some modes of operation. These two properties combine to give cMUTs a very broad band response. It also has the potential of being easily integrated to T/R electronics. Currently, most cMUTs are made using silicon on insulator (SOI) which requires hybrid techniques for integration. Despite the great promise of this technology there are several drawbacks.

First, cMUTs suffer from reduced sensitivity compared to piezoelectric transducers. This is due mainly to parasitic capacitance. Second, cMUTs require a DC bias to operate. This can complicate system design particularly for catheter and endoscope transducers. cMUT reliability is uncertain due to reliance on a bending mode resonance. cMUT elements are also prone to failure due to stiction. Furthermore, it is very difficult to apply cMUT technology to high frequency transducer arrays.

A variation of cMUT technology uses piezoelectric thin films to drive the diaphragms. The main advantage is that no bias is needed, but the bandwidth and sensitivity is very poor due to the low coupling resonance mode and the variable properties of thin film piezoelectrics.

These and other drawbacks are found in current transducer array systems.

What is needed are one dimensional (1-D) and two dimensional (2-D) arrays and a method for making them that is cost effective while providing a consistently reliable product from frequencies less than 2 MHz to greater than 100 MHz.

SUMMARY OF THE INVENTION

According to an exemplary embodiment of the invention, one and two dimensional piezoelectric composite micromachined ultrasound transducer (PC-MUT) arrays having through-wafer vias are disclosed. The piezoelectric may be a composite or piezocrystal material.

In one embodiment, a micromachined piezoelectric element for transducer and transducer arrays is disclosed that includes a plurality of piezoelectric structures and an epoxy separating the piezoelectric structure.

In another embodiment, a method of forming a micromachined piezoelectric element for transducer and transducer arrays is disclosed that includes providing a piezoelectric wafer; applying a photoresist to the piezoelectric wafer, electroplating the applied photoresist and wafer, etching the electroplated photoresist and wafer to form piezoelectric structures in the piezoelectric wafer; filling epoxy between the piezoelectric structures, reducing the thickness of the epoxy filled piezoelectric wafer to form a piezoelectric composite, and applying electrodes to the piezoelectric composite to form a piezoelectric composite element.

In another embodiment, a micromachined piezoelectric ultrasound transducer array is disclosed that includes a plurality of piezoelectric composite elements; and at least one through-wafer-via electrically interconnecting at least two of the plurality of piezoelectric composite elements.

In another embodiment, a method of forming a micromachined piezoelectric ultrasound transducer array element is disclosed that includes providing a piezoelectric wafer, forming vias in the piezoelectric wafer, forming piezoelectric structures in the piezoelectric wafer, filling epoxy between the piezoelectric structures, reducing the thickness of the piezoelectric wafer, applying electrodes to the piezoelectric wafer to form the micromachined piezoelectric ultrasound transducer array element Other features and advantages of the present invention will be apparent from the following more detailed description of exemplary embodiments, taken in conjunction with the accompanying drawings which illustrate, by way of example, the principles of the invention.

BRIEF DESCRIPTION OF THE DRAWINGS

FIG. 1 illustrates a schematic showing a process to make micromachined crystal transducers using deep reactive ion etching (DRIE).

FIG. 2A illustrates an exemplary micromachined 2-2 element according to the disclosure.

FIG. 2B illustrates an exemplary micromachined 1-3 element according to the invention.

DETAILED DESCRIPTION OF EXEMPLARY EMBODIMENTS

Figure 3A:
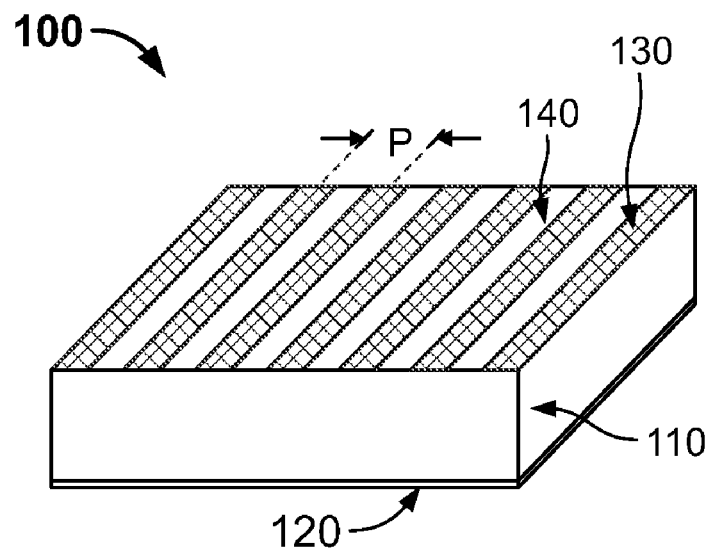
FIG. 3A illustrates an exemplary embodiment of a 1-D array according to the disclosure.

Exemplary embodiments of the invention are directed to overcoming the problems existing in the current transducer array fabrication by using photolithography-based micromachining of bulk piezoelectric materials, such as, but not limited to PZT, single crystal PMN-PT, single crystal PIN-PMN-PT, PT, and BST. The current disclosure discloses a multi-layer transducer array and a method for forming a multi-layer transducer array including deep etching to form through-wafer-vias. In one embodiment, the disclosed method can be used to form micromachined imaging transducers having a frequency range from less than 2 MHz to greater than 100 MHz. In another embodiment, the disclosed method can be used to form micromachined imaging transducers having a frequency range from about 1.5 MHz to about 300 MHz. In yet another embodiment, the disclosed method may be used to form transducers having a frequency range from about 20 MHz to about 100 MHz. The disclosed method forms transducers having increased array element electrical impedance that provides both improved SNR and matching to transmitter/receiver (T/R) electronics.

Exemplary embodiments of the invention address the problems seen in dicing-based fabrication of large numbers of small array elements by using lithography based micromachining for high throughput array fabrication. There is no mechanical stress interaction minimizing chance for element fracture. All exposed areas are etched at the same time, unlike pass-by-pass serial element definition that is done using dicing saw technology. This will greatly reduce transducer fabrication time, and make it possible to fabricate large numbers of arrays at low cost. Furthermore, lithography based micromachining can be used for fabrication of transducers with complex piezo element shapes, such as circular, triangle, etc., and is not limited to the rectangular and square shapes found in conventional dicing processes. This is helpful to minimize lateral modes existing in piezo composites.

Conventional dice-and-fill techniques have been used for fabrication of transducers and transducer arrays with a frequency of <2 MHz to about 20 MHz. More recently, PC-MUT fabrication has resulted in transducers with a frequency of about 20 MHz up to about 100 MHz. Exemplary embodiments of the invention extend the frequency range of transducer arrays fabricated using photolithography based micromachining to include frequencies less than 2 MHz to greater than 100 MHz.

Exemplary embodiments of the invention address poor match in transmitter/receiver (T/R) electronics and poor signal to noise ratios (SNR) by fabricating through-wafer-vias (TWV) using photolithography based micromachining for multi-layer arrays, so that the electrical impedance per element is significantly decreased. The TWVs also help integrate interconnection in single element transducers (positive and negative contact on the same side) and array transducers (contact pad arrays for integration with T/R switches and/or pre-amplifier circuits).

Photolithography based micromachined transducer and transducer array techniques have several advantages compared with conventional ultrasound transducer and transducer array fabrication, which include submicron machining precision, batch fabrication, capability of via holes fabrication, and a low-stress mechanical environment for fragile, fine structures, and great flexibility on composite transducer and array design. In addition, unlike other composite fabrication methods, the deep etching process involved in this invention is not limited by the area of material being etched. The area is only limited by the size of the vacuum chamber. This allows high throughput fabrication of large aperture transducer arrays.

According to the disclosure, multilayer 1-D and 2-D arrays having through-wafer vias (TWVs) that significantly decreased electrical impedance per element, and hence the improved electrical impedance matching to T/R electronics and improved signal to noise ratio are disclosed. The TWVs also facilitate integrated interconnection in single element transducers (positive and negative contact on the same side) and array transducers (contact pads array for integration with T/R switches and/or pre-amplifier circuits). This hybrid integration approach could further improve SNR, and make extremely compact ultrasound systems practical.

FIG. 1 shows an exemplary photolithography-based micromachining method for forming a high frequency single crystal/epoxy composite element or array according to an exemplary embodiment of the invention. In another embodiment, the method may be applied to other bulk piezoelectric materials. As shown in FIG. 1, according to a first step, a piezoelectric wafer 2 having a conductive material 6 plated on a polished surface is provided. The piezoelectric wafer 2 is formed of a bulk piezoelectric material. The bulk piezoelectric material may be a single crystal or ceramic piezoelectric material. The piezoelectric material may be lead magnesium niobate-lead titanate (PMN-PT), lead zinc niobate-lead titanate (PZN-PT), or other piezoelectric material. In one embodiment, the piezoelectric material is a ceramic or single crystal. In one embodiment, the piezoelectric material is a single crystal PMN-PT with electroded faces oriented along the <001> or <011> crystallographic directions. The piezoelectric material can desirably have a high piezoelectric coefficient. For example, the piezoelectric material may have a $d_{33}$>1500 pC/N, $k_{33}$>0.8, $k_{33}$>0.7. Furthermore, the piezoelectric material may have a dielectric constant in the range of approximately 4000 to approximately 7700, and a dielectric loss of less than 0.01. The piezoelectric wafer 2 has a thickness of about 0.2 mm to about 2 mm. In another embodiment, the piezoelectric wafer 2 has a thickness of 0.5 mm to a 2 mm. In yet another embodiment, the piezoelectric wafer 2 has a thickness of about 0.5 mm.

The piezoelectric wafer 2 is formed by lapping both sides of a bulk piezoelectric material, polishing one side of the lapped piezoelectric material to form a polished surface, and then coating the polished surface with a layer of the conductive material 6. The conductive material 6 has a thickness of about 50 nm to about 1 μm. In another embodiment, 0.3 μm to about 0.5 μm. In one embodiment, the conductive material 6 has a thickness of about 0.3 μm. The conductive material 6 may be a metal, metal alloy, conductive composite or other conductive material. For example, the conductive material 4 may be selected from, but not limited to, the group including nickel, chromium, chromium/gold films, chromium/nickel films, titanium/nickel films and titanium/gold films. The conductive material 6 serves as an electroplating seed layer.

According to a second step, a positive photoresist 8 is formed on the piezoelectric wafer 2. The positive photoresist 8 is formed by coating a photosensitive polymer material onto the conductive material 6, followed by heating for a predetermined time. The positive photoresist 8 defines the desired shape and/or pattern of piezoelectric structures 11 within the piezoelectric wafer 2. In one embodiment, the photoresist is heated at a temperature from about 70° C. to about 200° C. In another embodiment, the photoresist is heated at a temperature from about 90° C. to about 120° C. The heating step removes solvents and/or other volatile components from the polymer material. In one embodiment, the photoresist is heated for about 5 minutes to about 30 minutes. In another embodiment, the photoresist is heated for about 15 minutes. After heating, contact aligner exposure, direct laser writing, stepper lithography or other similar lithography method is used to pattern the photoresist 8. In one embodiment, the lithography is conducted using UV exposure. After UV exposure, the photoresist is developed in a developer solution to etch away the exposed photoresist material to form a photoresist structure 8 with straight side walls. In one embodiment, the photoresist 8 has a thickness of about 1 μm to about 100 μm. In another embodiment, the photoresist 8 has a thickness of about 5 μm to about 50 μm. In yet another embodiment, the photoresist 8 has a thickness of about 10 μm to about 15 μm. In yet still another embodiment, the photoresist 8 has a thickness of about 15 μm.

According to a third step, a plating process is next used to form a metal mask 10 on the piezoelectric wafer 2. To form the metal mask 10, a metal is deposited on top of the piezoelectric wafer 2 with photoresist 8. A portion of the photoresist 8 is then removed. The metal mask 10 may be deposited by electroplating. The metal may be nickel, copper, platinum, gold, other metal or metal alloys used as etching mask materials.

According to a fourth step, the piezoelectric wafer 2 is placed into an etching chamber to etch the piezoelectric wafer 2 to a predetermined depth to form piezoelectric structures 11 having gaps 13 therebetween. In one embodiment, the etching is a deep reactive ion etching (DRIE). Other etching processes can be used, such as wet-etching. In one embodiment, chlorine based DRIE is used, which results in a substantially vertical etching profile. In one embodiment, chlorine based DRIE is used to form an etching profile having a profile angle of greater than 80°. In another embodiment, in addition to or in place of chlorine, sulfur hexafluoride based etching is used, which results in a similar profile to chlorine based DRIE etching. The piezoelectric structures 11 may be bars 210 (see FIG. 2A) or posts 210' (see FIG. 2B). In one embodiment, the etching depth is from about 10 μm to greater than 200 μm. In another embodiment, the etching depth is about 20 μm to greater than about 60 μm. In another embodiment, the piezoelectric wafer 2 is etched to a depth of about 40 μm to about 120 μm. The etched piezoelectric wafer 2 is then cleaned in a metal etching solution.

According to a fifth step, the gaps 13 between the piezoelectric structures 11 are filled with epoxy 12 to form kerfs 14. The kerfs 10 provide structural stability and acoustic characteristics to the etched piezoelectric wafer 2. In one embodiment, the kerfs 14 have a kerf width of less than about 1 μm to about 30 μm. In another embodiment, the kerfs have a kerf width of about 0.25 μm to about 30 μm. In yet another embodiment, the kerfs have a kerf width of about 3 μm to about 30 μm.

According to a sixth step, a two side lapping process is used to remove any external epoxy and piezoelectric material not within the kerfs 10 so as to fabricate a piezo-composite element 17.

According to a sixth step, an electrode 18 is formed on the element 17. The electrode 18 may cover a whole side, or patterned electrodes may be formed on both sides. The electrode 18 is formed of a conductive material, for example, but not limited to a layered thin metal film such as Cr/Au films, chromium/nickel films, titanium/nickel films and titanium/gold films. After the electrode 18 is formed, a backing layer 20 is formed of an epoxy composite to form a composite transducer 22. An optional matching layer 22 may be deposited on an electrode layer 18 to enhance acoustic impedance matching, for example between the composite transducer 22 and tissue as required for the particular application.

FIGS. 2A and 2B illustrate an exemplary embodiment of micromachined piezoelectric composite elements 200a, 200b for transducer and transducer array applications for both 2-2 and 1-3 arrangements, respectively. As can be seen in FIG. 2A, the element 200a has a 2-2 arrangement and includes alternating piezoelectric bars 210 and epoxy 220. The element 200a further includes electrodes 230. A bottom surface electrode 230 covering the bottom surface of the element 200a is indicated by a solid line, and a top surface electrode covering the top surface of the element 200a is indicated by the dashed perimeter line In the 2-2 arrangement, the epoxy 220 separates the piezoelectrical bars 210 in one direction or axis as shown.

As can be seen in FIG. 2B, the element 200b has a 1-3 arrangement and includes piezoelectric posts 210' separated by epoxy 220. The element 200b further includes electrodes 230. A bottom surface electrode 230 covering the bottom surface of the element 200a is indicated by a solid line, and a top surface electrode covering the top surface of the element 200a is indicated by the dashed perimeter line. In the 2-2 arrangement, the epoxy 220 separates the piezoelectric posts 210 in two perpendicular directions or axis as shown.

Figure 3B:
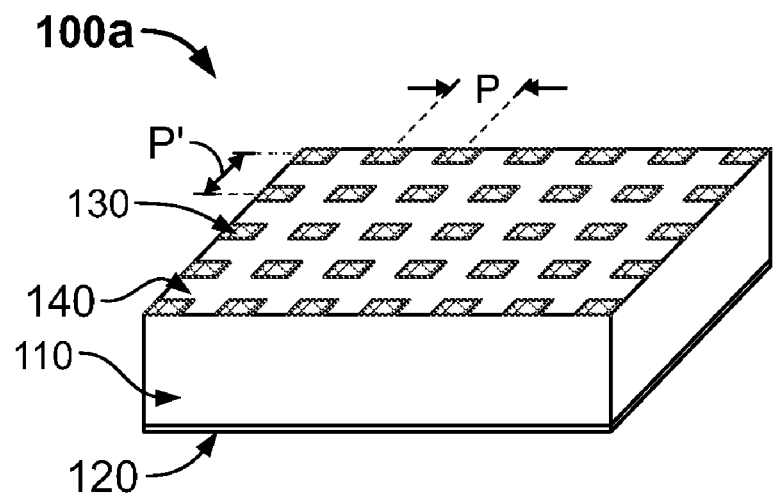
FIG. 3B illustrate an exemplary embodiment of a 2-D array according to the disclosure.

FIGS. 3A and 3B illustrate an exemplary embodiment of a 1-D array and a 2-D array according to the disclosure. As can be seen in FIG. 3A, 1-D array 100 includes either 2-2 or 1-3 elements 110, a ground electrode 120 and element electrodes 130 provided for each composite element 110. In the 1-D array 100, the elements 110 are separated in one direction or axis, 1-D, by kerfs 140. Kerfs 140 may be formed of epoxy, piezoelectric material, or a combination of both. Separation layers 140 separate each element 110 by a pitch P, as measured from element center to adjacent element center.

As can be seen in FIG. 3B, a 2-D array 100a includes either 2-2 or 1-3 elements 110, a ground electrode 120 and element electrodes 130 provided for each element 110. In the 2-D array 100a, the elements 110 are separated in two directions or axes, 2-D, by kerfs 140. The kerfs 140 may be formed of epoxy, piezoelectric material, or a combination of both. Kerfs 140 separate each element 110 by pitch P, P', as measured from element center to adjacent element center in each of the two directions. In this exemplary embodiment, each element 110 is shown with a square cross-section, however, in other embodiments, each element 110 may have a circular, rectangular or polygon cross-sectional geometry. In one embodiment, each element 110 may have a octagonal cross-sectional geometry.

According to the disclosure, PC-MUTs formed by a photolithography-based micromachining technique result in precise dimensions, making them particularly useful for pre-amplifier integration and multi-layer lamination. A multi-layer approach is effective because the piezoelectric plates are mechanically in series and electrically in parallel, increasing the element capacitance by a factor of $N^2$, where N is the number of layers. The clamped capacitance $C_0$ is then defined as:

$$C_0 = \frac{N^2 \varepsilon_r^s \varepsilon_0 A}{t} \quad (1)$$

where $\varepsilon_r^s$ is the relative clamped (high frequency) capacitance, $\varepsilon_0$ is permittivity of free space, A is area and t is thickness. This has the distinct advantage of decreasing element impedances from thousands of ohms to a few hundred with a few layers. This lower impedance increases the amount of power out by $N^2$. There is also an N times increase in received voltage at the end of an attached coaxial cable and a similar increase in SNR on transmission due to lower thermal noise. A four layer design could provide a 6 dB increase in SNR based on thermal noise alone and another 9 dB increase in SNR based on reduced signal reflection between transmit electronics and the transducer.

The fine pitch necessary for 2-D array elements, generally about 10 µm to about 80 µm, makes interconnection a challenge when moving to multi-layers. Through-wafer vias must be small enough so the acoustic field is not affected, which requires deep-etched, fine via holes as provided in this disclosure.

Figure 4:
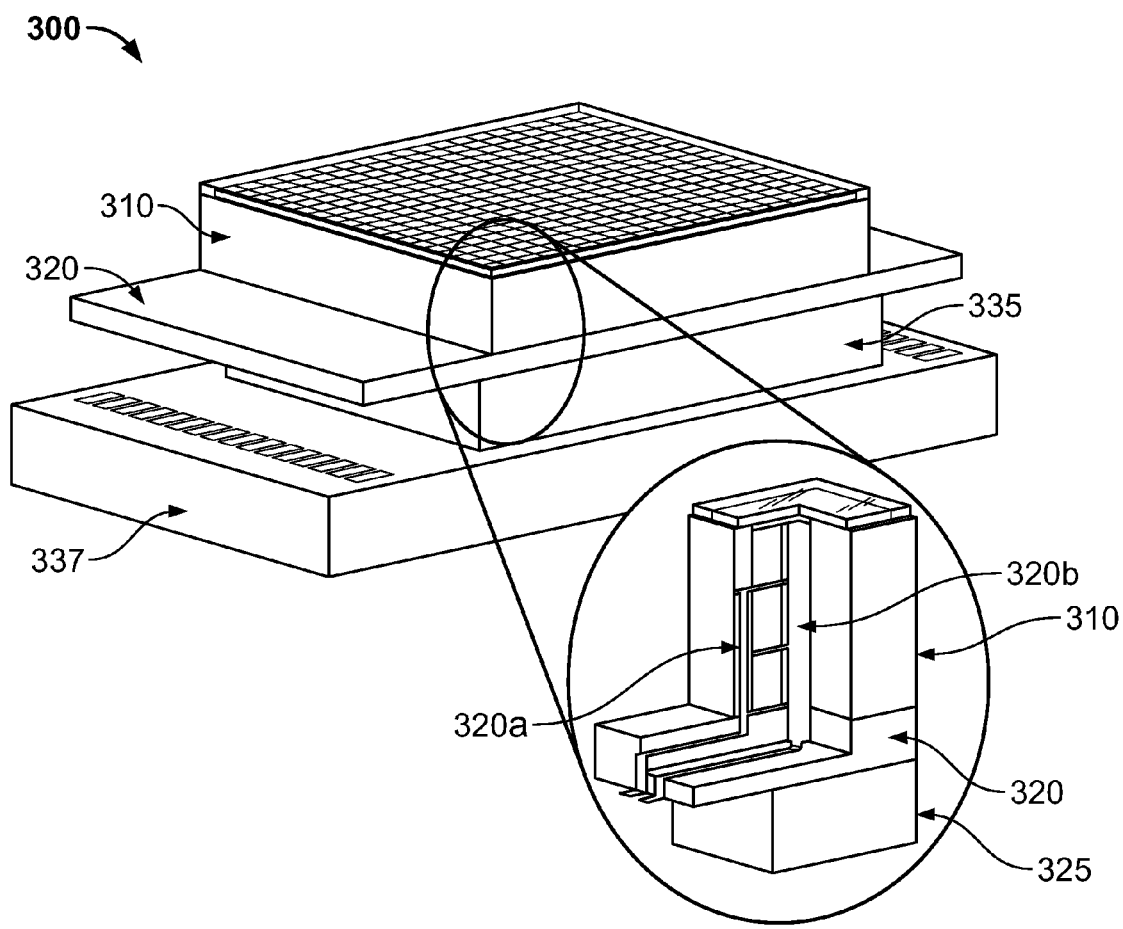
FIG. 4 illustrates a PC-MUT 2-D array in accordance with an exemplary embodiment of the invention.

FIG. 4 illustrates an exemplary embodiment of an integrated PC-MUT 2-D array 300 in accordance with the disclosure. The integrated array 300 includes at least one micromachined 1-3 element 310 made, for example, as described in accordance with the photolithographic method described above. In another embodiment, the elements 310 may have an alternative arrangement, for example, but not limited to a 2-2 arrangement. A matching layer 460 is placed on top of the elements 310.

The elements 310 include active connection through-wafer vias 320a and ground connection through-wafer vias 320b, which may be used to form single layer or multiple layer arrays. The vias 320a, 320b electrically connect one or more composites to a multi-layer flex circuit 330. In one embodiment, the vias 320a, 320b may have a circular, square, rectangular or polygon cross-sectional geometry. In one embodiment, the vias 320a, 320b have a circular cross-section having a diameter of about 5 µm to about 200 µm. In another embodiment, the vias 320a, 320b have a circular cross-section having a diameter of about 10 µm to about 70 µm. The flex circuit 320 may be physically connected by a backing 335 to a preamplifier board 337 for transmit/receive (T/R) switching and/or pre-amplifier electronics, which may be used to form a fully integrated ultrasound probe (not shown). In one embodiment, the 1-3 composite 310 includes kerfs (not shown) having a kerf width of less than about 1 µm to about 30 µm. In another embodiment, the element 310 includes kerfs having a kerf width of about 0.25 µm to about 30 µm. In yet another embodiment, the composite includes kerfs having a kerf width of about 3 µm to about 30 µm and a pitch P of about 10 µm to about 80 µm.

Figure 5:
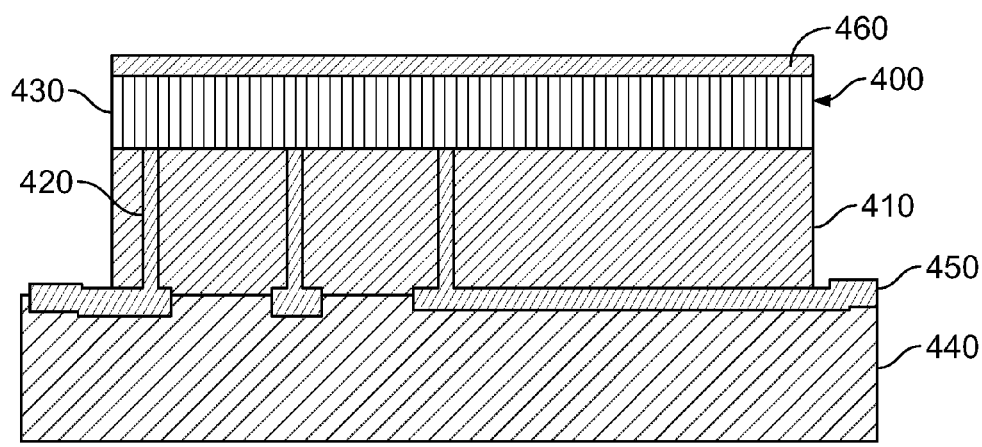
FIG. 5 illustrates an integrated PC-MUT array in accordance with another embodiment of the invention.

FIG. 5 illustrates an alternative embodiment of an integrated PC-MUT array 400 in accordance with another exemplary embodiment of the disclosure. In this alternative embodiment, the integrated PC-MUT array 400 includes a transducer backing 410 with vias 420 to attach multiple elements 430 directly to a switch substrate 440 having electrical contacts 450. The switch substrate 400 having electrical contacts 450 may be a preamplifier circuit board. The array 400 also includes a matching layer 460.

Figure 6:
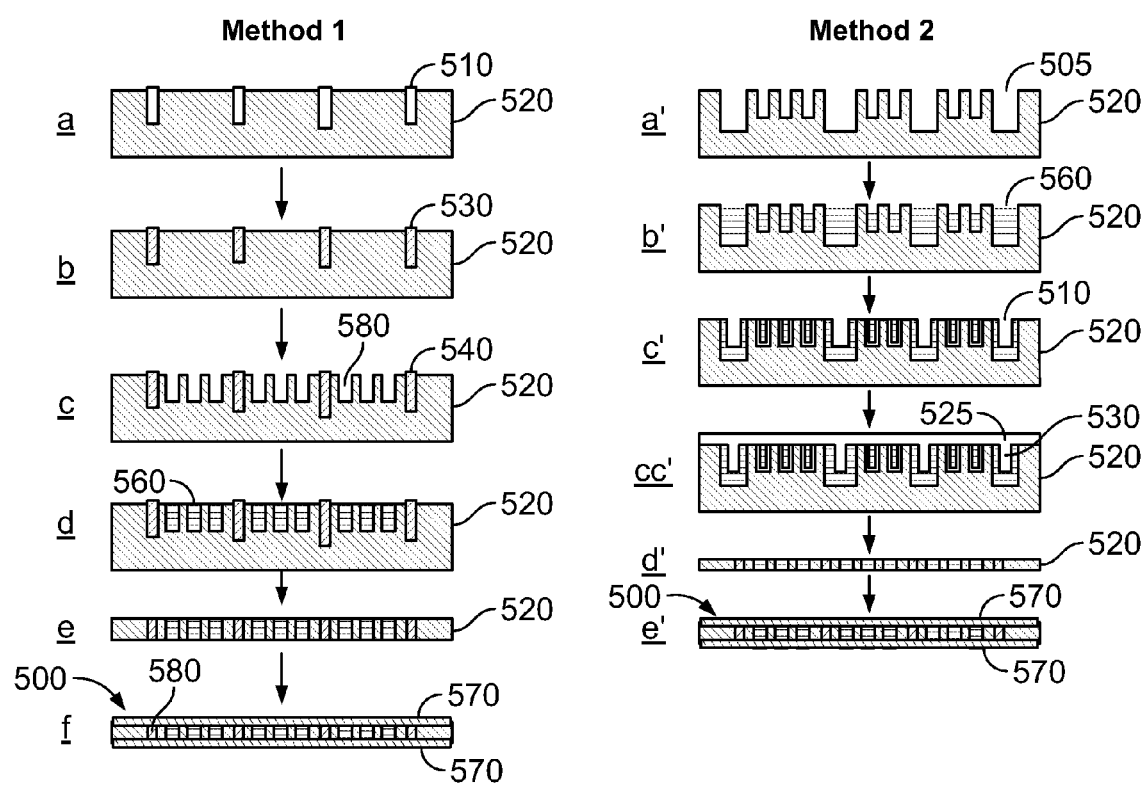
FIG. 6 illustrates two different methods for fabricating PC-MUTs with through-wafer vias.

FIG. 6 illustrates two exemplary methods, Method 1 and Method 2, for fabricating a PC-MUT element 500 having through-wafer vias according to the disclosure. As shown in FIG. 6, Method 1 includes, according to a first step a, forming via holes 510 in a piezoelectric wafer 520 by deep reactive ion etching (DRIE). According to a second step b, the via holes are filled with a conductive material 530, such as but not limited to a metal or metal alloy. In one embodiment, the conductive material is copper. According to a third step c, the wafer 520 is etched by DRIE to form piezoelectric structures 540 separated by slots 550 in the wafer 520. The piezoelectric structures 540 may be bars or posts as described above. According to a fourth step d, the slots 550 are filled with epoxy 560. According to a fifth step e, the wafer 520 is lapped on both sides and polished. According to a sixth step f, the lapped and polished wafer 520 is plated by sputtering or other similar method with an electrode material 570 to form a piezoelectrical element 500 having conductive vias 580. The electrode material may be selected from conductive thin metal films including, but not limited to chromium/gold films, chromium/nickel films, titanium/nickel films and titanium/gold films.

As further shown in FIG. 6, Method 2 includes, according to a first step a', forming via holes 510, piezoelectric structures 540 and slots 550 in a wafer 520 by an etching process. In one embodiment, the etching process is a DRIE process. According to a second step b', the via holes 510 and slots 550 are filled with epoxy. According to a third step c', via holes 510 are formed by laser drilling or other mechanical or chemical material removal process. According to a fourth step cc', vias 530 are formed by filling the via holes 510 with a conductive material 525 by a deposition process such as electroless plating, electroplating, sputtering or vapor deposition.

According to a fifth step d', the wafer 520 is lapped to obtain a desired thickness and polished. According to a sixth step e', a chromium/gold (Cr/Au) layered film electrode is sputtered or otherwise applied onto both sides of the wafer 520 and patterned as needed to form a piezoelectrical element 500 having vias 580.

Figure 7:
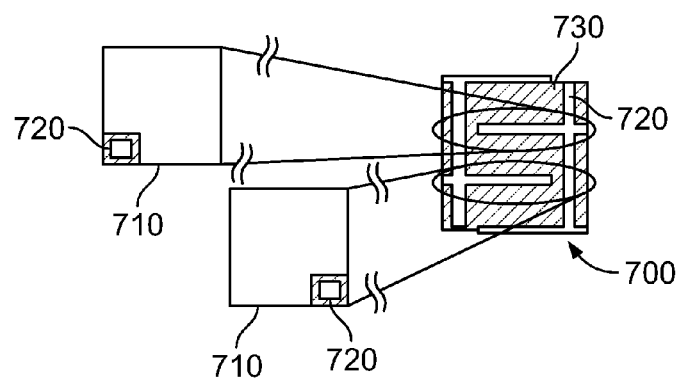
FIG. 7 illustrates a through-wafer via interconnection for a multilayer PC-MUT.

FIG. 7 illustrates an exemplary embodiment of a multilayer PC-MUT 700 according to the invention. As can be seen in FIG. 7, the multilayer PC-MUT 700 includes PC-MUT elements 710 that are interconnected through vias 720. The transducer body material 730 may be piezoelectrical material, epoxy or a combination thereof. Each PC-MUT element 710 includes surface electrode patterning as determined by the specific application. In one embodiment, the PC-MUT elements 710 may be a single element. In another embodiment, the PC-MUT elements 710 may include multiple elements. In yet another exemplary embodiment, the PC-MUT elements 710 are 2-D arrays. In still another exemplary embodiment, the PC-MUT elements are 1-D arrays.

Figure 7A:
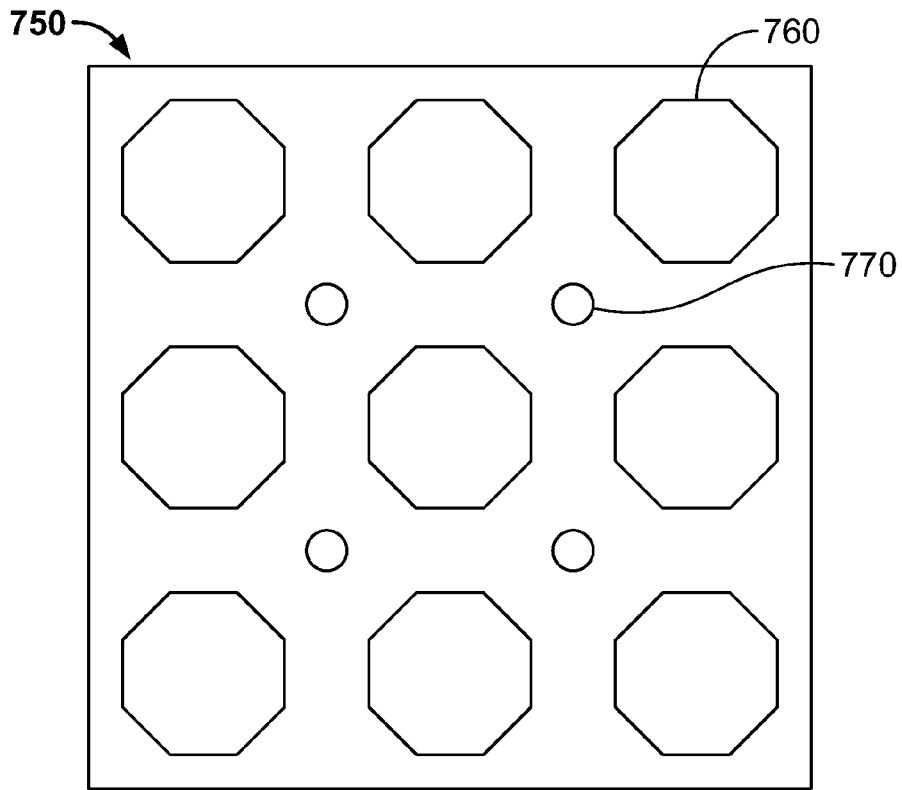
FIG. 7A illustrates a top view of an exemplary 2-D array according to the disclosure.
Figure 7B:
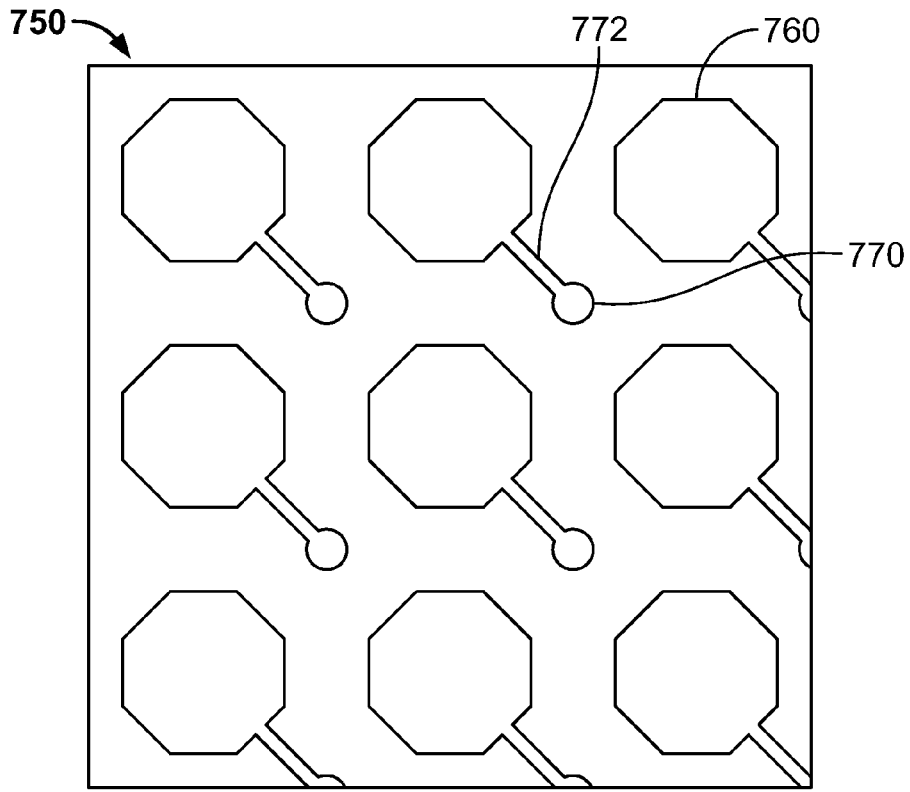
FIG. 7B illustrates a bottom view of an exemplary 2-D array according to the disclosure.

FIGS. 7A and 7B illustrate a top and bottom view, respectively, of an exemplary 2-D array 750. The 2-D array 750 includes electrodes 760 on composite elements (not shown) and vias 770. The vias 770 are filled with electroplated copper. As can be seen in FIG. 7B, the electrodes 760 and vias 770 are electrically connected by traces 772 on the bottom side 775 of the 2-D array 750. In another embodiment, the electrodes 760 and vias 770 may be connected on the top side 780. The 2-D array 750 is shown having nine electrodes and composite elements, however, any number of electrodes and composite elements may be used.

The conductive vias 770 allow both positive and negative contacts (not shown) of each element (not shown) in 2-D array 750 to be on the same side of the element, which simplifies the interconnection of a multilayer 2-D arrays. For example, with a flex circuit (as shown in FIG. 8), the 2-D array elements shown in FIGS. 7A and 7B can be bonded to form a multi-layer 2-D array having low electrical impedance to improve the electrical impedance match in transmitter/receiver (T/R) electronics and therefore, increase SNR.

Interconnections (whether single layer or multilayer) for each element in a 2-D array can be addressed individually either by 1) fabricating vias directly into the transducer backing material for direct bonding to a preamplifier circuit board or 2) fabricating a multi-layer flex circuit for bonding between the composite and backing. In one embodiment, a multi-layer flex circuit design with a fan-out pattern is used. The flex circuit may be a polyimide flex circuit, which can be up to seven layers thick, with each layer as thin as 25 μm. Multiple layers of polyimide may be built up using spin coating, after which a photoresist may be applied and masked with the pattern for that layer. After electroplating and photoresist removal, the next flex layer is spin coated and the process is repeated with the appropriate layer mask.

Figure 8:
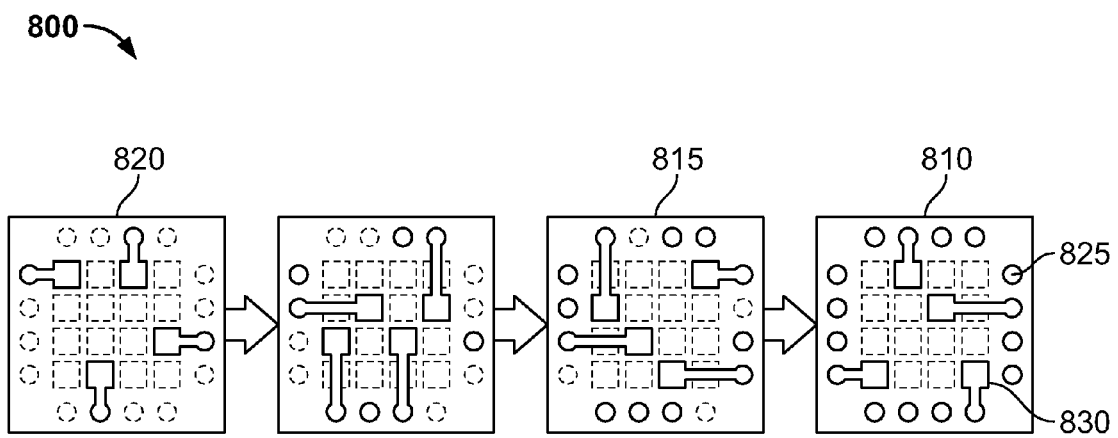
FIG. 8 illustrates a multilayer flex for a 2D array.

An illustration of a multilayer flex circuit 800 is shown in FIG. 8. The multilayer flex circuit 800 includes a bottom layer 810 and a top layer 820. The circuit 800 may include one or more intermediate layers 815 stacked between the bottom layer 810 and the top layer 820 as indicated by the arrows. The layers 810, 820 include through-hole vias 825 by which conductive traces and/or circuitry 830 is interconnected. In one exemplary embodiment, a PC-MUT (not shown) would be bonded to the top layer 820 and a preamplifier board or other similar substrate (not shown) would be bonded to the back of the bottom layer at the through-hole vias 828 to form a transducer having a frequency range from less than 2 MHz to greater than 100 MHz. In another embodiment, a PC-MUT (not shown) would be bonded to the top layer 820 and a preamplifier board or other similar substrate (not shown) would be bonded to the back of the bottom layer at the through-hole vias 828 to form a transducer having a frequency range from less than about 1.5 MHz to about 300 MHz.

While the foregoing specification illustrates and describes exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A micromachined piezoelectric ultrasound transducer array, comprising:
a plurality of piezoelectric composite elements;
at least one through-wafer-via electrically interconnecting at least two of the plurality of piezoelectric composite elements.

2. The array of claim 1, wherein at least one of the through-wafer-via electrically interconnects at least one of the plurality of piezoelectric composite elements to a flex circuit.

3. The array of claim 2, wherein the flex circuit is a multi-layer flex circuit.

4. The array of claim 1, wherein at least one of the through-wafer-via electrically interconnects at least one of the plurality of piezoelectric composite elements directly to a transducer backing material.

5. The array of claim 1, wherein at least one of the through-wafer via directly bonds the backing material to a preamplifier circuit board.

6. The array of claim 1, wherein the plurality of piezoelectric composite elements have a 2-2 arrangement.

7. The array of claim 1, wherein the plurality of piezoelectric composite elements have a 1-3 arrangement.

8. The array of claim 1, wherein the plurality of piezoelectric composite elements comprise a piezoelectric material selected from the group comprising PZT, PMN-PT, PIN-PMN-PT, PT and BST.

* * * * *